United States Patent
Zhang et al.

(10) Patent No.: US 8,335,324 B2
(45) Date of Patent: Dec. 18, 2012

(54) METHOD AND APPARATUS FOR AUTOMATIC VOLUME ADJUSTMENT

(75) Inventors: Ming Zhang, Cupertino, CA (US); Chi-Chian Yu, San Ramon, CA (US)

(73) Assignee: Fortemedia, Inc., Sunnyvale, CA (US)

( * ) Notice: Subject to any disclaimer, the term of this patent is extended or adjusted under 35 U.S.C. 154(b) by 692 days.

(21) Appl. No.: 12/343,842

(22) Filed: Dec. 24, 2008

(65) Prior Publication Data
US 2010/0158275 A1  Jun. 24, 2010

(51) Int. Cl.
*H03G 3/00* (2006.01)
(52) U.S. Cl. ... 381/107; 381/106; 381/105; 379/381.01; 379/388.02; 379/388.03
(58) Field of Classification Search ............. 379/381.01, 379/388.02, 388.03, 390.01, 390.03, 395; 381/56–57, 86, 104, 107, 317, 321
See application file for complete search history.

(56) References Cited

U.S. PATENT DOCUMENTS

| 7,142,678 B2 * | 11/2006 | Falcon | 381/107 |
| 7,447,635 B1 * | 11/2008 | Konopka et al. | 704/275 |
| 2008/0137874 A1 * | 6/2008 | Christoph | 381/57 |

* cited by examiner

*Primary Examiner* — Evan Pert
*Assistant Examiner* — Mark A Laurenzi
(74) *Attorney, Agent, or Firm* — McClure, Quarley & Rodack, LLP

(57) ABSTRACT

The invention provides an apparatus capable of automatic volume adjustment. In one embodiment, the apparatus comprises a speaker, an array microphone located in the vicinity of the speaker, a beamforming module, a signal-to-noise ratio calculation module, and a volume adjustment module. The speaker first broadcasts a first audio signal. The array microphone converts a sound into a plurality of second audio signals. The beamforming module derives a speaker sound signal and an ambient noise signal from the second audio signals, wherein the speaker sound signal mainly comprises speaker sound components generated by the speaker and the ambient noise signal mainly comprises noises other than the speaker sound components. The signal-to-noise ratio calculation module calculates a ratio of a first power of the speaker sound signal to a second power of the ambient noise signal to obtain a signal-to-noise ratio. The volume adjustment module then adjusts a volume of the first audio signal according to the signal-to-noise ratio before the first audio signal is delivered to the speaker.

20 Claims, 4 Drawing Sheets

METHOD AND APPARATUS FOR AUTOMATIC VOLUME ADJUSTMENT

BACKGROUND OF THE INVENTION

1. Field of the Invention

The invention relates to audio signal processing, and more particularly to automatic volume adjustment for audio signals.

2. Description of the Related Art

A computer is capable of playing movies or music files such as MP3 and MP4 for entertainment. However, the noise level of a surrounding environment of the computer, may change with changes in the surrounding environment. For example, a surrounding environment of the computer may be noisy during the daytime due to increased activity, but quiet during the early morning or late evening. Thus, users must manually adjust speaker volume of the computer when playing a movie or listening to music, to suit the noise level of the surrounding environment. For example, a louder volume is required when the surrounding environment of the computer is noisy.

In addition to a computer, portable devices, such as notebooks, MP3 players, cell phones, or personal digital assistants (PDAs), may also play music. As such, the noise level of a surrounding environment of the portable devices, is even more likely to change due to the portability of the devices. Accordingly, if the portable device is in a noisy surrounding environment, a louder volume is required and a user must manually increase the volume for playing the music. However, frequent manual volume adjustments, are inconvenient for users. Thus, a method for automatic volume adjustment is required.

BRIEF SUMMARY OF THE INVENTION

The invention provides an apparatus capable of automatic volume adjustment. In one embodiment, the apparatus comprises a speaker, an array microphone located in the vicinity of the speaker, a beamforming module, a signal-to-noise ratio calculation module, and a volume adjustment module. The speaker first broadcasts a first audio signal. The array microphone converts a sound into a plurality of second audio signals. The beamforming module derives a speaker sound signal and an ambient noise signal from the second audio signals, wherein the speaker sound signal mainly comprises speaker sound components generated by the speaker and the ambient noise signal mainly comprises noises other than the speaker sound components. The signal-to-noise ratio calculation module calculates a ratio of a first power of the speaker sound signal to a second power of the ambient noise signal to obtain a signal-to-noise ratio. The volume adjustment module then adjusts a volume of the first audio signal according to the signal-to-noise ratio before the first audio signal is delivered to the speaker.

The invention also provides a method for automatic volume adjustment. First, a first audio signal is broadcasted with a speaker. A sound in the vicinity of the speaker is then converted into a plurality of second audio signals with an array microphone. A speaker sound signal and an ambient noise signal are then derived from the second audio signals, wherein the speaker sound signal mainly comprises speaker sound components generated by the speaker and the ambient noise signal mainly comprises noises other than the speaker sound components. A ratio of a first power of the speaker sound signal to a second power of the ambient noise signal is then calculated to obtain a signal-to-noise ratio. Finally, a volume of the first audio signal is adjusted according to the signal-to-noise ratio before the first audio signal is delivered to the speaker.

The invention also provides another method for automatic volume adjustment. First, a first audio signal is broadcasted with a speaker. A sound is then converted into a second audio signal with a microphone located in the vicinity of the speaker. An ambient noise component is retrieved from the second audio signal. A plurality of parameters of an equalizer are then set according to the ambient noise component. Finally, the first audio signal is filtered with the equalizer before the first audio signal is delivered to the speaker.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
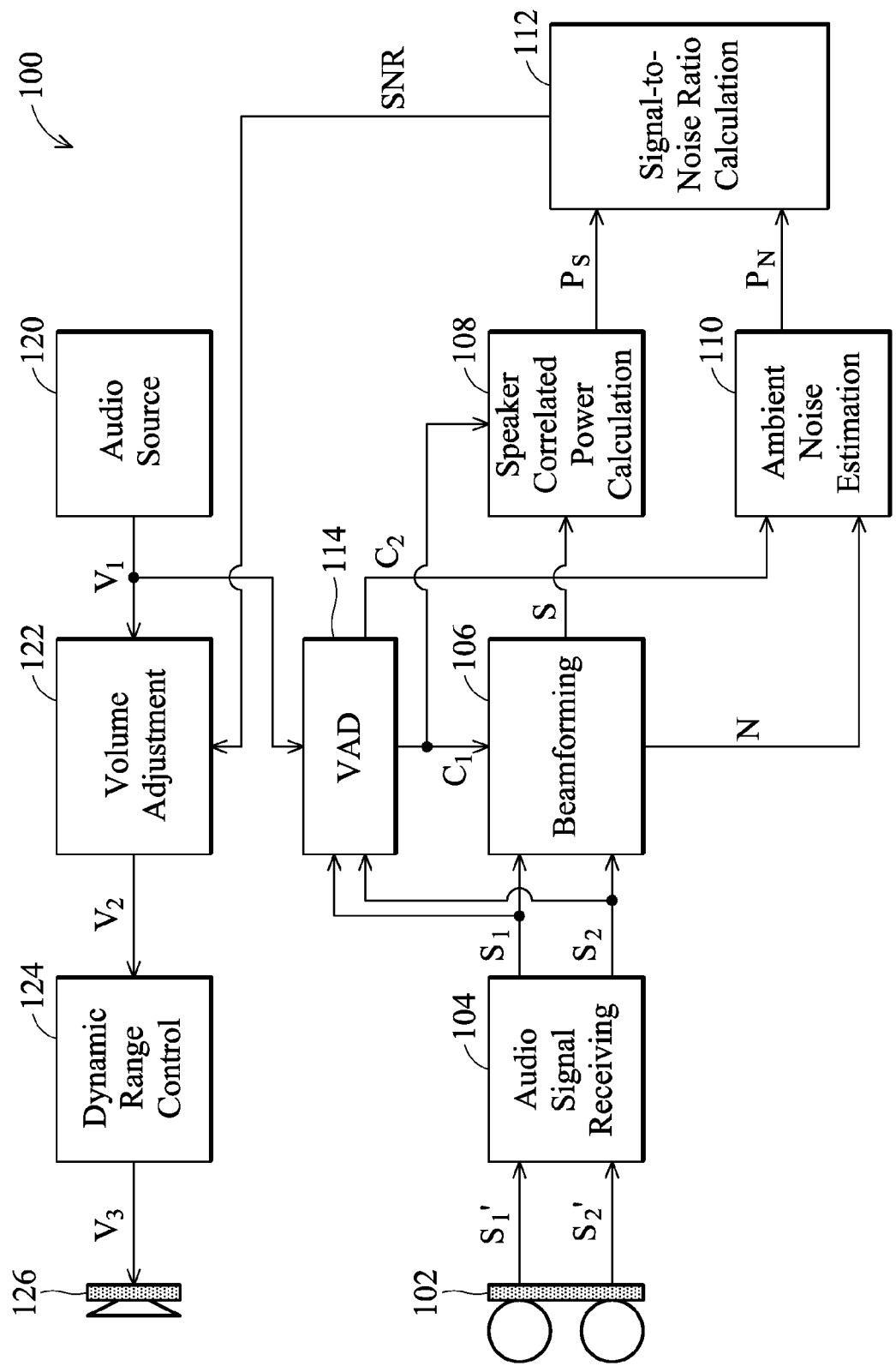
FIG. 1 is a block diagram of an apparatus capable of automatic volume adjustment according to the invention.

Referring to FIG. 1, a block diagram of an apparatus 100 capable of automatic volume adjustment according to the invention is shown. In one embodiment, the apparatus is a computer. In another embodiment, the apparatus 100 is a portable device, such as a notebook, a cell phone, a music player, or a personal digital assistant (PDA). The apparatus 100 detects a level of an ambient noise as a reference for automatically adjusting a volume of a broadcasted signal $V_1$. In one embodiment, the apparatus 100 comprises an array microphone 102, an audio signal receiving module 104, a beamforming module 106, a speaker correlated power calculation module 108, an ambient noise estimation module 110, a signal-to-noise ratio calculation module 112, a voice activity detector 114, an audio source 120, a volume adjustment module 122, a dynamic range control module 124, and a speaker 126. The audio source 120 generates an audio signal $V_1$ to be played. The volume adjustment module 122 then adjusts a volume of the audio signal $V_1$ to obtain an audio signal $V_2$. The dynamic range control module 124 then clamps amplitudes of peaks of the audio signal $V_2$ to a threshold level for saturation prevention to obtain an audio signal $V_3$. The speaker 126 then broadcasts the audio signal $V_3$, thus enabling a user to hear the audio signal $V_3$.

The array microphone 102 is located within a vicinity of the speaker 126 and comprises a plurality of microphones. When the speaker 126 broadcasts the audio signal $V_3$, the microphones of the array microphone 102 convert the sounds within the vicinity of the speaker 126 into a plurality of audio signals $S_1'$ and $S_2'$. The audio signals $S_1'$ and $S_2'$ therefore comprise speaker sound components generated by the speaker 126 and ambient noise components other than the speaker sound components. The audio signal receiving module 104 then slightly adjusts the audio signals $S_1'$ and $S_2'$ to obtain audio signals $S_1$ and $S_2$. The voice activity detector 114 then detects whether the audio signals $S_1$ and $S_2$ are correlated with the broadcasted audio signal $V_1$. If so, the audio signals $S_1$ and $S_2$ comprise speaker sound components generated by the speaker 126, and the voice activity detector 114 generates a control signal $C_1$ to enable the beamforming module 106 and the speaker correlated power calculation module 108 to calculate a speaker signal power $P_S$. Otherwise, the audio signals $S_1$ and $S_2$ do not comprise speaker sound components, and the voice activity detector 114 generates a control signal $C_2$ to enable the ambient noise estimation module 110 to calculate an ambient noise power $P_N$.

The beamforming module 106 then derives a speaker sound signal S and an ambient noise signal N from the audio signals $S_1$ and $S_2$ generated by the array microphone 102. The speaker sound signal S mainly comprises the speaker sound components of the audio signals $S_1$ and $S_2$, and the ambient noise signal N mainly comprises the ambient noise components of the audio signals $S_1$ and $S_2$. A detailed embodiment of the beamforming module 106 will be illustrated with FIG. 2. The speaker correlated power calculation module 108 then measures a power of the speaker sound signal S as the speaker signal power $P_S$, and the ambient noise estimation module 110 then measures a power of the ambient noise signal N as the ambient noise power $P_N$. The signal-to-noise ratio calculation module 112 then divides the speaker signal power $P_S$ by the ambient noise power $P_N$ to obtain a signal-to-noise ratio SNR.

The volume adjustment module 122 then adjusts a volume of the audio signal $V_1$ according to the signal-to-noise ratio SNR generated by the signal-to-noise ratio calculation module 112 to obtain the audio signal $V_2$. In one embodiment, when the signal-to-noise ratio SNR is less than a threshold level, the volume adjustment module 122 increases the volume of the audio signal $V_2$, thus enabling the broadcasted audio signal $V_2$ audible by a user in a noisy environment. When the signal-to-noise ratio SNR is greater than a threshold level, the volume adjustment module 122 decreases the volume of the audio signal $V_2$, thus avoiding loud noises caused by the broadcasted audio signal $V_2$. Thus, the apparatus 100 automatically adjusts the volume of the audio signal $V_2$ according to a noise level of the surrounding environment to make the audio signal $V_2$ audible to the user. The dynamical range control module 124 then detects whether amplitude of the audio signal $V_2$ is greater than a threshold level. If so, the dynamic range control module 124 clamps the amplitude of the audio signal $V_2$ to the threshold level to obtain the audio signal $V_3$ delivered to the speaker 126, thus preventing the speaker 126 from saturation.

Figure 2:
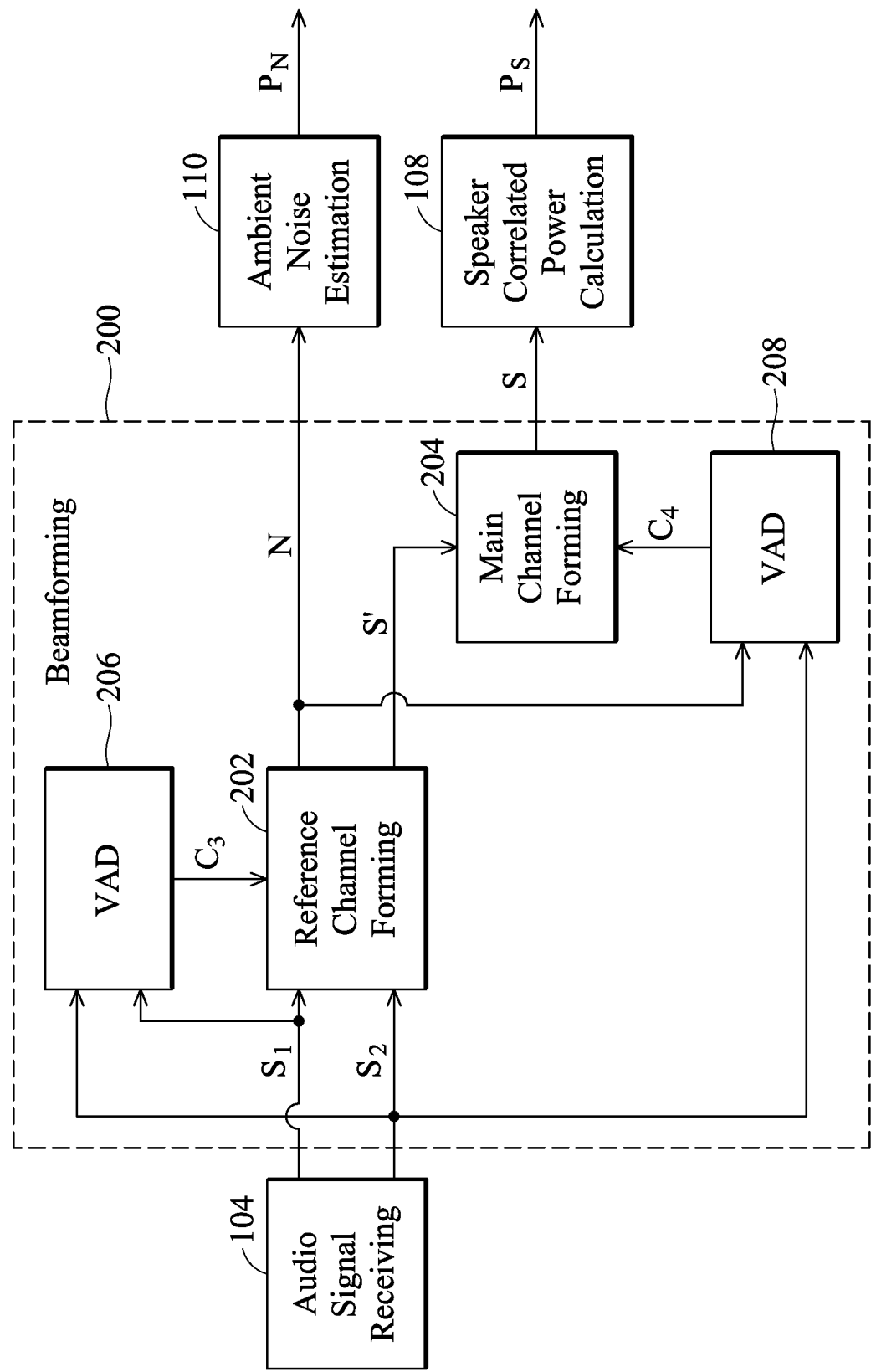
FIG. 2 is a block diagram of a beamforming module according to the invention.

Referring to FIG. 2, a block diagram of a beamforming module 200 according to the invention is shown. In one embodiment, the beamforming module 200 comprises a reference channel forming module 202, a main channel forming module 204, and two voice activity detectors 206 and 208. The voice activity detector 206 detects whether the audio signals $S_1$ and $S_2$ generated by the audio signal receiving module 104 comprise ambient noise components. If so, the voice activity detector 206 generates a control signal $C_3$ to enable the reference channel forming module 202 to generate the ambient noise signal N. In one embodiment, the reference channel forming module 202 removes the speaker sound components from the audio signals $S_1$ and $S_2$ to obtain the ambient noise signal N. The ambient noise signal N is then delivered to the ambient noise estimation module 110 to calculate the ambient noise power $P_N$.

In addition, the reference channel forming module 202 retains the speaker sound components of the audio signals $S_1$ and $S_2$ to obtain a residual signal $S'$. The residual signal $S'$ is then delivered to the main channel forming module 204. The voice activity detector 208 then detects whether the audio signal $S_1$ or $S_2$ comprises loud noises. In one embodiment, the voice activity detector 208 compares the power levels of the audio signals $S_1$ and $S_2$ with that of the ambient noise signal N. If the power level of the audio signal $S_1$ or the audio signal $S_2$ is approximately the same as that of the ambient noise signal, the audio signal $S_1$ or $S_2$ is determined to comprise loud noises, and the voice activity detector 208 generates a control signal $C_4$ to enable the main channel forming module 205. The main channel forming module 205 then removes the loud noises from the residual signal $S'$ to obtain the speaker sound signal S. The speaker sound signal S is then delivered to the speaker correlated power calculation module 108 to calculate the speaker signal power $P_S$.

Figure 3:
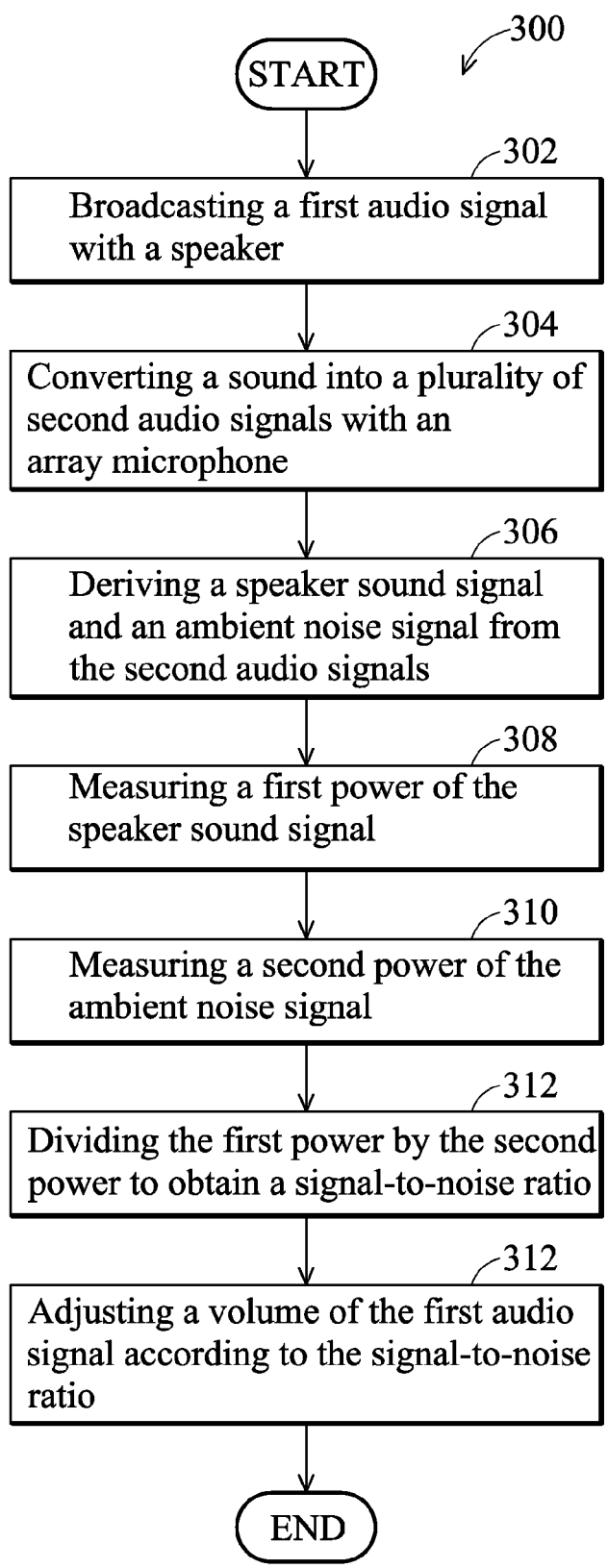
FIG. 3 is a flowchart of a method for automatic volume adjustment according to the invention.

Referring to FIG. 3, a flowchart of a method 300 for automatic volume adjustment according to the invention is shown. First, a first audio signal $V_3$ is broadcasted with a speaker (step 302). A sound in the vicinity of the speaker is then converted into a plurality of second audio signals $S_1$ and $S_2$ with an array microphone (step 304). The sound and the second audio signals $S_1$ and $S_2$ therefore comprise speaker sound components generated by the speaker. A speaker sound signal S and an ambient noise signal N are then derived from the second audio signals $S_1$ and $S_2$ (step 306), wherein the speaker sound signal S mainly comprises the speaker sound components of the second audio signals $S_1$ and $S_2$, and the ambient noise signal N mainly comprises noise components of the second audio signals $S_1$ and $S_2$. A first power $P_S$ of the speaker sound signal S is then measured (step 308). Similarly, a second power $P_N$ of the ambient noise signal N is then measured (step 310). The first power $P_S$ is then divided by the second power $P_N$ to obtain a signal-to-noise ratio SNR (step 312). Finally, a volume of the first audio signal $V_2$ is adjusted according to the signal-to-noise ratio SNR before the first audio signal $V_2$ is broadcasted (step 314). For example, the volume of the first audio signal $V_2$ is increased when the signal-to-noise ratio SNR is less than a threshold level, and the volume of the first audio signal $V_2$ is decreased when the signal-to-noise ratio SNR is greater than the threshold level. Thus, the volume of the broadcasted audio signal $V_3$ is automatically adjusted according to a noise level of the surrounding environment, sustaining audibility of the audio signal $V_3$.

Figure 4:
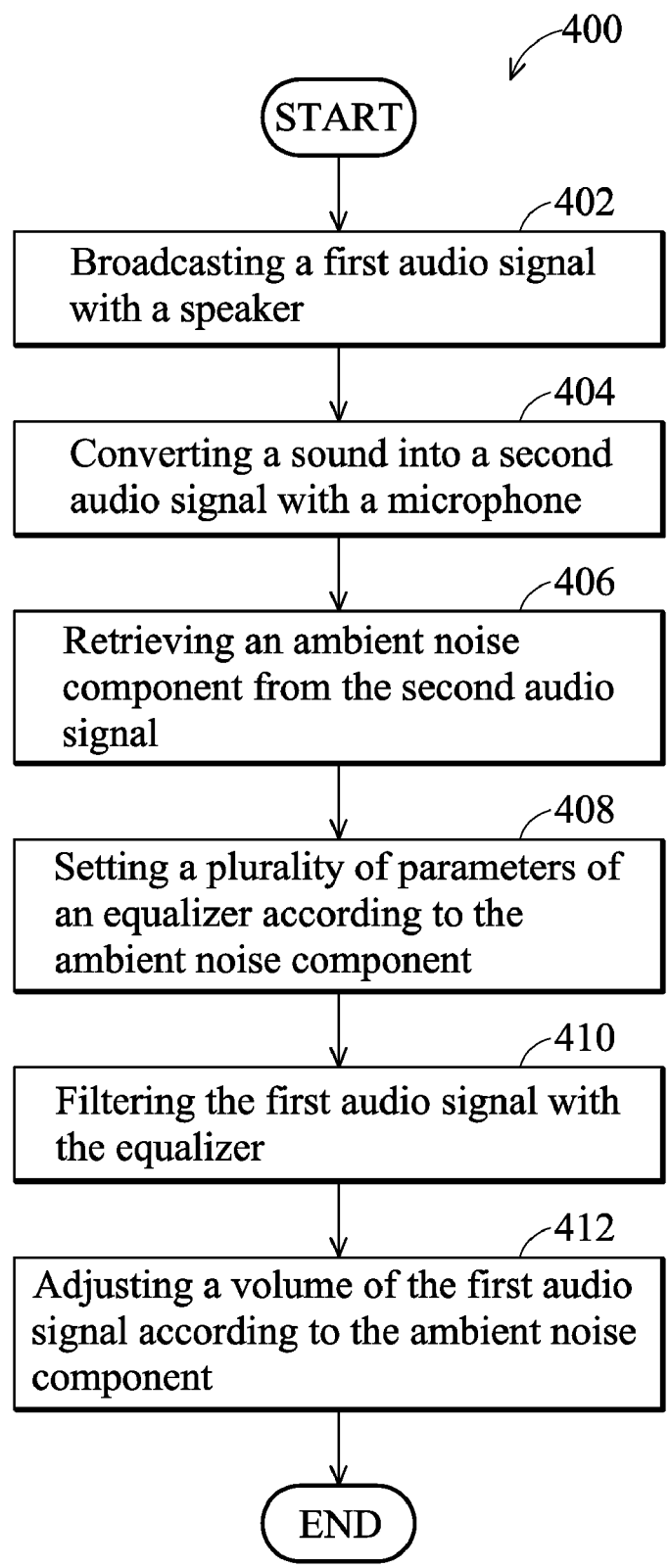
FIG. 4 is a flowchart of another embodiment of a method for automatic volume adjustment according to the invention.

Referring to FIG. 4, a flowchart of another embodiment of a method 400 for automatic volume adjustment according to the invention is shown. First, a first audio signal is broadcasted with a speaker (step 402). A sound is then converted into a second audio signal with a microphone (step 404). An ambient noise component of the second audio signal is then retrieved from the second audio signal (step 406) to represent a level of surrounding environment noises. In one embodiment, the microphone is an array microphone, and retrieving of the ambient noise component is performed by a beamforming module. A plurality of parameters of an equalizer are then set according to the ambient noise component (step 408). In one embodiment, the parameters include a channel impulse response of the first audio signal. The first audio signal is then filtered with the equalizer (step 410), thus adjusting properties of the first audio signal to break through the environment noises. Finally, a volume of the first audio signal is also adjusted according to the ambient noise component (step 412).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus capable of automatic volume adjustment, comprising:
   a speaker, broadcasting a first audio signal;
   an array microphone, located in the vicinity of the speaker, converting a sound into a plurality of second audio signals;
   a beamforming module, deriving a speaker sound signal and an ambient noise signal from the second audio signals, wherein the speaker sound signal mainly comprises speaker sound components generated by the speaker and the ambient noise signal mainly comprises noises other than the speaker sound components;
   a signal-to-noise ratio calculation module, calculating a ratio of a first power of the speaker sound signal to a second power of the ambient noise signal to obtain a signal-to-noise ratio; and
   a volume adjustment module, before the first audio signal is delivered to the speaker, increasing a volume of the first audio signal when the signal-to-noise ratio is less than a threshold level, and decreasing the volume of the first audio signal when the signal-to-noise ratio is greater than the threshold level.

2. The apparatus as claimed in claim 1, wherein the apparatus further comprises:
   a speaker correlated power calculation module, measuring the first power of the speaker sound signal; and
   an ambient noise estimation module, measuring the second power of the ambient noise signal.

3. The apparatus as claimed in claim 2, wherein the apparatus further comprises a first voice activity detector, detecting whether the second audio signals comprise the speaker sound components, enabling the beamforming module and the speaker correlated power calculation module when the second audio signals comprise the speaker sound components, and enabling the ambient noise estimation module when the second audio signals do not comprise the speaker sound components.

4. The apparatus as claimed in claim 3, wherein the first voice activity detector detects whether the second audio signals are correlated with the first audio signal to determine whether the second audio signals comprise the speaker sound components.

5. The apparatus as claimed in claim 1, wherein the beamforming module comprises:
   a reference channel forming module, removing the speaker sound components from the second audio signals to obtain the ambient noise signal, and retaining the speaker sound components of the second audio signals to obtain a residual signal; and
   a main channel forming module, removing loud noises from the residual signal to obtain the speaker sound signal.

6. The apparatus as claimed in claim 5, wherein the beamforming module comprises:
   a second voice activity detector, detecting whether the second audio signals comprise noises, and enabling the reference channel forming module when the second audio signals comprise noises; and
   a third voice activity detector, detecting whether power levels of the second audio signals are approximate to that of the ambient noise signal, and enabling the main channel forming module when the power levels of the second audio signals are approximate to that of the ambient noise signal.

7. The apparatus as claimed in claim 1, wherein the apparatus further comprises a dynamic range control module, coupled between the volume adjustment module and the speaker, detecting whether an amplitude of the first audio signal is greater than a threshold level, and clamping the amplitude of the first audio signal to the threshold level before the first audio signal is delivered to the speaker when the amplitude of the first audio signal is greater than the threshold level.

8. The apparatus as claimed in claim 1, wherein the apparatus is a computer, a notebook, a cell phone, a music player, or a personal digital assistant (PDA).

9. A method for automatic volume adjustment, comprising:
   broadcasting a first audio signal with a speaker;
   converting a sound in the vicinity of the speaker into a plurality of second audio signals with an array microphone;
   deriving a speaker sound signal and an ambient noise signal from the second audio signals, wherein the speaker sound signal mainly comprises speaker sound components generated by the speaker and the ambient noise signal mainly comprises noises other than the speaker sound components;
   calculating a ratio of a first power of the speaker sound signal to a second power of the ambient noise signal to obtain a signal-to-noise ratio; and
   adjusting a volume of the first audio signal according to the signal-to-noise ratio before the first audio signal is delivered to the speaker.

10. The method as claimed in claim 9, wherein the method further comprises:
    determining whether the second audio signals comprise the speaker sound components;
    measuring the first power of the speaker sound signal when the second audio signals comprise the speaker sound components; and
    measuring the second power of the ambient noise signal when the second audio signals do not comprise the speaker sound components.

11. The method as claimed in claim 10, wherein determination of whether the second audio signals comprise the speaker sound components comprises detecting whether the second audio signals are correlated with the first audio signal.

12. The method as claimed in claim 9, wherein derivation of the speaker sound signal and the ambient noise signal comprises:
    removing the speaker sound components from the second audio signals to obtain the ambient noise signal;
    retaining the speaker sound components of the second audio signals to obtain a residual signal; and
    removing loud noises from the residual signal to obtain the speaker sound signal.

13. The method as claimed in claim 12, wherein derivation of the speaker sound signal and the ambient noise signal further comprises:
    detecting whether the second audio signals comprise noises;
    triggering the removal of the speaker sound components from the second audio signals to generate the ambient noise signal when the second audio signals comprise noises;

detecting whether power levels of the second audio signals are approximate to that of the ambient noise signal; and triggering the removal of the loud noises from the residual signal to generate the speaker sound signal when the power levels of the second audio signals are approximate to that of the ambient noise signal.

14. The method as claimed in claim 9, wherein adjustment of the volume comprises:

increasing the volume of the first audio signal when the signal-to-noise ratio is less than a threshold level, and decreasing the volume of the first audio signal when the signal-to-noise ratio is greater than the threshold level.

15. The method as claimed in claim 9, wherein the method further comprises:

detecting whether an amplitude of the first audio signal is greater than a threshold level; and clamping the amplitude of the first audio signal to the threshold level when the amplitude of the first audio signal is greater than the threshold level.

16. A method for automatic volume adjustment, comprising:

broadcasting a first audio signal with a speaker;

converting a sound into a second audio signal with a microphone located in the vicinity of the speaker;

retrieving an ambient noise component from the second audio signal;

setting a plurality of parameters of an equalizer according to the ambient noise component; and filtering the first audio signal with the equalizer before the first audio signal is delivered to the speaker.

17. The method as claimed in claim 16, wherein the plurality of parameters includes a channel impulse response of the first audio signal.

18. The method as claimed in claim 16, wherein the microphone is an array microphone, and retrieving of the ambient noise component is performed by a beamforming module.

19. The method as claimed in claim 16, wherein the method further comprises adjusting a volume of the first audio signal according to the ambient noise component before the first audio signal is delivered to the speaker.

20. The method as claimed in claim 19, wherein adjustment of the volume comprises:

increasing the volume of the first audio signal when a power of the ambient noise component is greater than a threshold level; and decreasing the volume of the first audio signal when the power of the ambient noise component is less than a threshold level.

* * * * *